United States Patent
Ike et al.

(10) Patent No.: US 11,830,741 B2
(45) Date of Patent: Nov. 28, 2023

(54) METHOD FOR FORMING FILM

(71) Applicant: Tokyo Electron Limited, Tokyo (JP)

(72) Inventors: Shinichi Ike, Hwaseong-si (KR); Shuji Azumo, Nirasaki (JP); Yumiko Kawano, Nirasaki (JP); Hiroki Murakami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 254 days.

(21) Appl. No.: 17/593,065

(22) PCT Filed: Feb. 28, 2020

(86) PCT No.: PCT/JP2020/008224
§ 371 (c)(1),
(2) Date: Sep. 8, 2021

(87) PCT Pub. No.: WO2020/184212
PCT Pub. Date: Sep. 17, 2020

(65) Prior Publication Data
US 2022/0189778 A1  Jun. 16, 2022

(30) Foreign Application Priority Data
Mar. 13, 2019 (JP) .................. 2019-046077

(51) Int. Cl.
*H01L 21/385* (2006.01)
*H01L 21/02* (2006.01)
*H01L 21/285* (2006.01)

(52) U.S. Cl.
CPC .. *H01L 21/28568* (2013.01); *H01L 21/02068* (2013.01); *H01L 21/02211* (2013.01)

(58) Field of Classification Search
None
See application file for complete search history.

(56) References Cited

U.S. PATENT DOCUMENTS 10,332,747 B1 * 6/2019 Watanabe ............. C23C 16/042
11,584,986 B1 * 2/2023 Abelson ........... H01L 21/28562
(Continued)

FOREIGN PATENT DOCUMENTS

JP   2007-501902 A    2/2007
JP   2007-533156 A   11/2007
(Continued)

OTHER PUBLICATIONS

Lee et al., "Thermal Atomic Layer Etching of Titanium Nitride Using Sequential, Self-Limiting Reactions: Oxidation to TiO2 and Fluorination to Volatile TiF4", Chem. Mater., 2017, 29 (19), pp. 8202-8210.

*Primary Examiner* — Asok K Sarkar
(74) *Attorney, Agent, or Firm* — Armstrong Teasdale LLP (57) ABSTRACT

A method of selectively forming a film on a substrate includes: a preparation process of preparing a substrate having a surface to which a metal film and an insulating film are exposed; a first removal process of removing a natural oxide film on the metal film; a first film forming process of forming a self-assembled monolayer, which suppresses formation of a titanium nitride film, on the insulating film by providing the substrate with a compound for forming the self-assembled monolayer, the compound having a functional group containing fluorine and carbon; a second film forming process of forming a titanium nitride film on the metal film; an oxidation process of oxidizing the surface of the substrate; and a second removal process of removing a titanium oxide film, which is formed on the metal film and the self-assembled monolayer, by providing the surface of the substrate with the compound.

12 Claims, 5 Drawing Sheets

(56) References Cited

U.S. PATENT DOCUMENTS

| | | | |
|---|---|---|---|
| 2019/0148144 A1* | 5/2019 | Liu | C23C 16/00 257/632 |
| 2019/0198318 A1* | 6/2019 | Bhuyan | H01L 21/321 |
| 2019/0316256 A1* | 10/2019 | Bhuyan | C23C 16/04 |
| 2020/0350204 A1* | 11/2020 | Yu | H01L 21/76844 |

FOREIGN PATENT DOCUMENTS

| | | |
|---|---|---|
| JP | 2010-540773 A | 12/2010 |
| JP | 2013-520028 A | 5/2013 |

* cited by examiner

METHOD FOR FORMING FILM

CROSS-REFERENCE TO RELATED APPLICATIONS

This application is a National Stage Application of International Patent Application No. PCT/JP2020/008224, having an International Filing Date of Feb. 28, 2020, which claims the benefit of priority to Japanese Patent Application No. 2019-046077, filed Mar. 13, 2019, each of which is hereby incorporated by reference herein.

TECHNICAL FIELD

Various aspects and embodiments of the present disclosure relate to a film forming method.

BACKGROUND

In manufacturing semiconductor devices, photolithography technology is widely used as a technology for selectively forming a film on a specific region on a surface of a substrate. For example, a wiring is formed by forming an insulating film after forming a lower layer wiring, forming a dual damascene structure having trenches and via holes through photolithography and etching, and embedding a conductive film such as Cu in the trenches and the via holes.

However, recent progress in miniaturization of semiconductor devices resulted in cases where the photolithography technology does not provide sufficient accuracy in position alignment.

Therefore, there is a demand for a method of selectively forming a film in a specific region on a surface of a substrate without using the photolithography technology. As such a method, a technique for forming a self-assembled monolayer (SAM) in a region of a surface of a substrate for which film formation is not required and forming a predetermined film only in a region of the surface of the substrate on which the SAM is not formed has been proposed (see, for example, Patent Documents 1 to 4 and Non-Patent Document 1).

PRIOR ART DOCUMENTS

Patent Documents

Patent Document 1: Japanese Laid-Open Patent Publication No. 2007-501902
Patent Document 2: Japanese Laid-Open Patent Publication No. 2007-533156
Patent Document 3: Japanese Laid-Open Patent Publication No. 2010-540773
Patent Document 4: Japanese Laid-Open Patent Publication No. 2013-520028

Non-Patent Document

Non-Patent Document 1: Younghee Lee and Steven M. George "Thermal Atomic Layer Etching of Titanium Nitride Using Sequential, Self-Limiting Reactions; Oxidation to $TiO_2$ and Fluorination to Volatile $TiF_4$" Chem. Mater., 2017, 29(19), pp 8202-8210

SUMMARY

The present disclosure provides a film forming method capable of improving productivity of a semiconductor device by using selective film formation.

An aspect of the present disclosure relates to a method of selectively forming a film on a substrate. The method includes a preparation process, a first removal process, a first film forming process, a second film forming process, an oxidation process, and a second removal process. In the preparation process, a substrate having a surface to which a metal film and an insulating film are exposed is prepared. In the first removal process, a natural oxide film on the metal film is removed. In the first film forming process, a self-assembled monolayer, which suppresses formation of a titanium nitride film, is formed on the insulating film by providing the substrate with a compound for forming the self-assembled monolayer, the compound having a functional group containing fluorine and carbon. In the second film forming process, a titanium nitride film is formed on the metal film. In the oxidation process, the surface of the substrate is oxidized. In the second removal process, a titanium oxide film, which is formed on the metal film and the self-assembled monolayer, is removed by providing the surface of the substrate with the compound for forming the self-assembled monolayer.

According to various aspects and embodiments of the present disclosure, it is possible to enhance productivity of a semiconductor device by using selective film formation.

DETAILED DESCRIPTION

Hereinafter, embodiments of a film forming method disclosed herein will be described in detail with reference to the drawings. The film forming method disclosed herein is not limited by the following embodiments.

In a conventional selective film formation, an SAM is supplied on a substrate having a surface to which a metal film and an insulating film are exposed, and the SAM is formed on the insulating film. Then, when a titanium nitride film is formed on the substrate, the SAM suppresses formation of the titanium nitride film on the insulating film, and the titanium nitride film is formed on the metal film. However, although a growth rate of nuclei of the titanium nitride film is slower than that on the metal film, the nuclei of the titanium nitride film also grow on the SAM. Thus, when the formation of the titanium nitride film continues, the titanium nitride film is also formed on the SAM. Therefore, in a stage in which the formation of the titanium nitride film has progressed to some extent, the nuclei of the titanium nitride film on the SAM are removed.

The nuclei of the titanium nitride film can be removed by, for example, providing the surface of the substrate with hydrogen fluoride. However, the SAM is easily decomposed by hydrogen fluoride. Thus, by providing the surface of the substrate with hydrogen fluoride, the SAM on the insulating film is reduced, and the function of the SAM, which suppresses the formation of the titanium nitride film on the insulating film, is reduced. Therefore, when the formation of the titanium nitride film continues as is after the nuclei of the titanium nitride film are removed, the titanium nitride film is likely to be formed on the insulating film as well.

For the reasons described above, in order to perform selective film formation, it is necessary to restore the function of the SAM, which suppresses the formation of the titanium nitride film on the insulating film, by performing a process of adsorbing the SAM on the insulating film again after the nuclei of the titanium nitride film are removed by hydrogen fluoride. Since it takes time to adsorb the SAM on the surface of the insulating film at a high density, it is required to improve productivity of the entire process of selectively forming the titanium nitride film having a desired film thickness only on the metal film.

Therefore, the present disclosure provides a film forming method capable of improving productivity of a semiconductor device by using selective film formation.

[Film Forming System]

Figure 1:
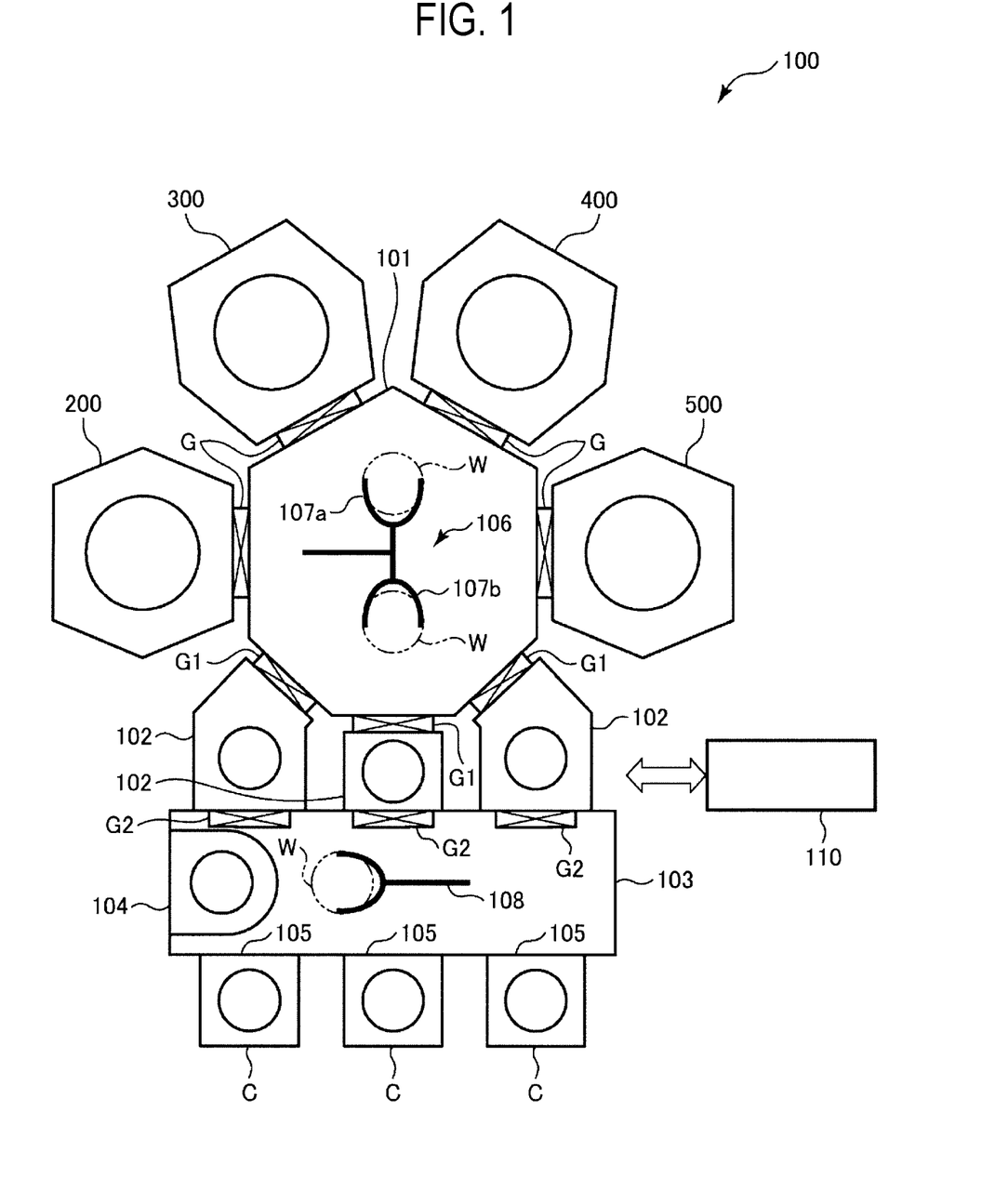
FIG. 1 is a view illustrating an exemplary film forming system according to an embodiment of the present disclosure.

FIG. 1 is a schematic view illustrating an exemplary film forming system 100 according to an embodiment of the present disclosure. The film forming system 100 includes a plasma processing apparatus 200, an SAM supply apparatus 300, a film forming apparatus 400, and an oxidation apparatus 500. These apparatuses are connected to four side walls of a vacuum transfer chamber 101 having a heptagonal shape in a plan view via gate valves G, respectively. The film forming system 100 is a multi-chamber-type vacuum processing system. The inside of the vacuum transfer chamber 101 is evacuated by a vacuum pump, and is maintained at a predetermined degree of vacuum. The film forming system 100 is capable of selectively forming a titanium nitride film on an insulating film of a substrate W having a surface to which a metal film and an insulating film are exposed, by using the plasma processing apparatus 200, the SAM supply apparatus 300, the film forming apparatus 400, and the oxidation apparatus 500.

The plasma processing apparatus 200 performs a process of removing a natural oxide film on the surface of the metal film of the substrate W by plasma. In the present embodiment, the plasma processing apparatus 200 removes the natural oxide film on the surface of the metal film of the substrate W by using, for example, plasma of hydrogen gas.

The SAM supply apparatus 300 forms an SAM in a region of the insulating film of the substrate W by providing the surface of the substrate W with a gas of an organic compound for forming the SAM. In addition, the SAM supply apparatus 300 removes a titanium oxide film by providing the substrate W after oxidation with the organic compound gas for forming the SAM.

In the present embodiment, the organic compound for forming the SAM has a functional group containing fluorine and carbon, and has a function of suppressing formation of a titanium nitride film. The organic compound for forming the SAM include, for example, a binding functional group adsorbed on the surface of the insulating film, a functional group containing fluorine and carbon, and an alkyl chain connecting the binding functional group and the functional group. As such, an organic compound, for example, a trichlorosilane-based SAM, a methoxysilane-based SAM, an ethoxysilane-based SAM, or the like may be used. Examples of the trichlorosilane-based SAM include $CF_3(CF_2)_XCH_2CH_2SiCl_3$. Examples of the methoxysilane-based SAM include $CF_3(CF_2)_XCH_2CH_2Si(OCH_3)_3$. Examples of the ethoxysilane-based SAM include $CF_3(CF_2)_XCH_2CH_2Si(OCH_2CH_3)_3$. "X" in the above-mentioned chemical formulae is an integer of 0 to 13.

The film forming apparatus 400 forms a titanium nitride film on the metal film of the substrate W. In the present embodiment, the film forming apparatus 400 forms the titanium nitride film on the substrate W through atomic layer deposition (ALD) using a raw material gas and a reaction gas. As the raw material gas, for example, a gas of an organic compound, such as tetrakis(dimethylamino)titanium (TDMATi) or tetrakis(ethylmethylamino) titanium (TEMATi), $TiCl_4$ gas, or the like may be used. As the reaction gas, for example, $NH_3$ gas or the like may be used.

The oxidation apparatus 500 performs a process of oxidizing the surface of the substrate W after the titanium nitride film is formed by the film forming apparatus 400. In the present embodiment, the surface of the substrate W is oxidized by, for example, providing the surface of the substrate W with $H_2O$ gas. Alternatively, the surface of the substrate W may be oxidized by, for example, providing the surface of the substrate W with $H_2O_2$ gas, $O_2$ gas, or $O_3$ gas).

Three load-lock chambers 102 are connected to the other three side walls of the vacuum transfer chamber 101 via gate valves G1, respectively. An atmospheric transfer chamber 103 is provided on a side opposite to the vacuum transfer chamber 101 with the load-lock chambers 102 interposed therebetween. Each of the three load-lock chambers 102 is connected to the atmospheric transfer chamber 103 via a gate valve G2. The load-lock chambers 102 perform a pressure control between atmospheric pressure and a vacuum when the substrate W is transferred between the atmospheric transfer chamber 103 and the vacuum transfer chamber 101.

Three ports 105, where each of a carrier (e.g., front-opening unified pod (FOUP)) C for accommodating substrates W is mounted, are provided on a side surface of the atmospheric transfer chamber 103 opposite to the surface provided with the gate valves G2. In addition, on a side wall of the atmospheric transfer chamber 103, an alignment chamber 104 is provided so as to perform alignment of the substrates W. A downflow of clean air is formed in the atmospheric transfer chamber 103.

A transfer mechanism 106, such as a robot arm, is provided in the vacuum transfer chamber 101. The transfer mechanism 106 transfers substrates W among the plasma processing apparatus 200, the SAM supply apparatus 300, the film forming apparatus 400, the oxidation apparatus 500, and the respective load-lock chambers 102. The transfer mechanism 106 has two arms 107a and 107b, which are independently movable.

A transfer mechanism 108, such as a robot arm, is provided in the atmospheric transfer chamber 103. The transfer mechanism 108 transfers substrates W among the respective carriers C, the respective load-lock chambers 102, and the alignment chamber 104.

The film forming system 100 has a controller 110 having a memory, a processor, and an input/output interface. The memory stores a program to be executed by the processor and a recipe including conditions for respective processes. The processor executes the program read from the memory and controls individual components of the film forming system 100 via the input/output interface based on the recipe stored in the memory.

[Film Forming Method]

Figure 2:
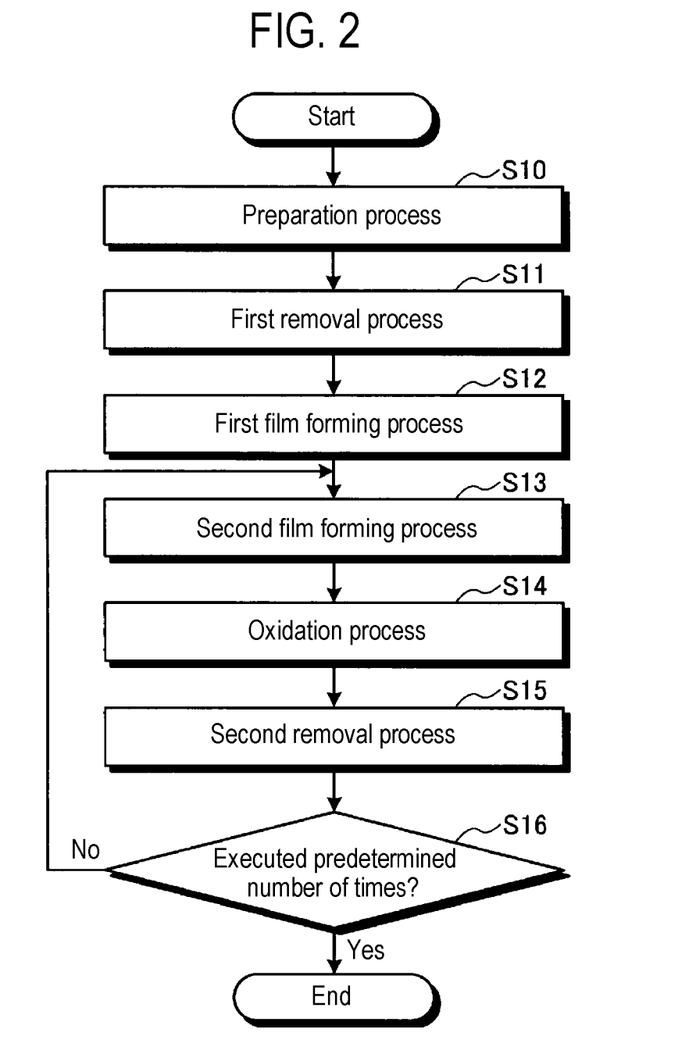
FIG. 2 is a flowchart illustrating an exemplary film forming method according to an embodiment of the present disclosure.

FIG. 2 is a flowchart illustrating an exemplary film forming method according to an embodiment of the present disclosure. In the present embodiment, for example, the film forming system 100 illustrated in FIG. 1 selectively forms a titanium nitride film on a metal film of a substrate W having a surface to which the metal film and an insulating film are exposed. The film forming method illustrated in the flowchart of FIG. 2 is implemented by controlling individual components of the film forming system 100 by the controller 110. Hereinafter, an exemplary film forming method according to an embodiment of the present disclosure will be described with reference to FIGS. 3 to 8.

Figure 3:
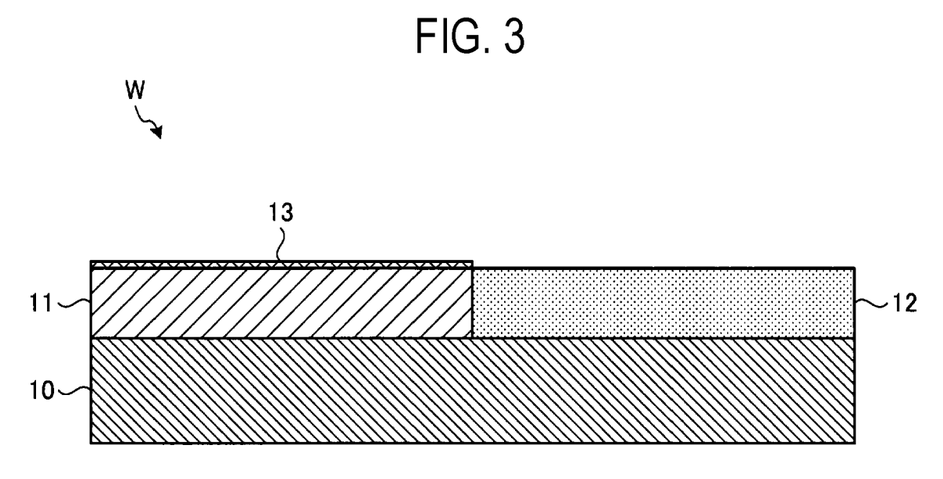
FIG. 3 is a cross-sectional view illustrating an exemplary substrate prepared in a preparation process.

First, a preparation process is executed (step S10). In the preparation process of step S10, for example, as illustrated in FIG. 3, a substrate W having a metal film 11 and an insulating film 12, which are formed on a base material 10, is prepared. FIG. 3 is a cross-sectional view illustrating an exemplary substrate W prepared in the preparation process. In the present embodiment, the base material 10 is, for example, silicon. The metal film 11 is a film of, for example, amorphous silicon, copper, tungsten, cobalt, or the like. The insulating film 12 is, for example, a silicon oxide film, a silicon nitride film, a spin-on carbon film, or the like. On a surface of the metal film 11, a natural oxide film 13 is formed in the process of transferring the substrate W in the air.

The substrate W prepared in step S10 is accommodated in the carrier C and set in the port 105. Then, the substrate W is taken out from the carrier C by the transfer mechanism 108, passed through the alignment chamber 104, and then loaded into one of the load-lock chambers 102. Then, after the inside of the load-lock chamber 102 is vacuum-evacuated, the substrate W is unloaded from the load-lock chamber 102 by the transfer mechanism 106 and loaded into the plasma processing apparatus 200.

Subsequently, a first removal process is executed (S11). In the first removal process of step S11, plasma of, for example, hydrogen gas is generated in the plasma processing apparatus 200 into which the substrate W has been loaded, and the natural oxide film 13 formed on the surface of the metal film 11 of the substrate W is removed. As a result, the surface of the metal film 11 is terminated with hydrogen atoms. The main processing conditions in the first removal process of step S11 are, for example, as follows.

Figure 4:
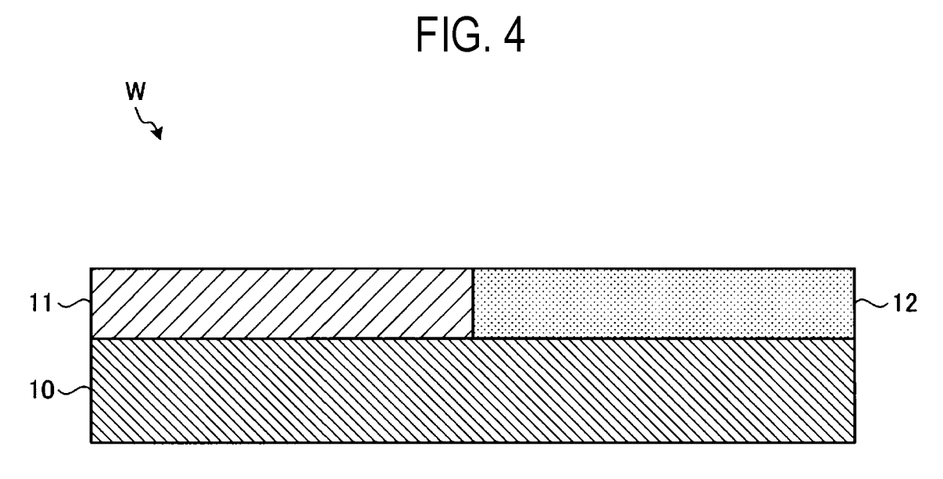
FIG. 4 is a cross-sectional view illustrating an exemplary substrate after a natural oxide film on a metal film is removed.

Temperature of the substrate W: 100 to 450 degrees C.
Pressure: 1 to 10 Torr
Flow rate of hydrogen gas: 100 to 2,000 sccm
RF frequency: 450 kHz to 13.56 MHz
RF power: 100 to 500 W
Processing time: 10 to 300 seconds As a result, a state of the substrate W becomes, for example, as illustrated in FIG. 4. FIG. 4 is a cross-sectional view illustrating an exemplary substrate W after the natural oxide film 13 on the metal film 11 is removed. After the process of step S11 is executed, the substrate W is unloaded from the plasma processing apparatus 200 by the transfer mechanism 106 and loaded into the SAM supply apparatus 300.

Subsequently, a first film forming process is executed (S12). In the first film forming process of step S12, a gas of an organic compound for forming an SAM is supplied into the SAM supply apparatus 300 into which the substrate W has been loaded. On the substrate W, molecules of the organic compound supplied into the SAM supply apparatus 300 are not adsorbed on the surface of the metal film 11, which has been terminated with hydrogen atoms, but are adsorbed on a surface of the insulating film 12 having OH groups so as to form an SAM on the insulating film 12. The main processing conditions in the first film forming process of step S12 are, for example, as follows.

Temperature of the substrate W: 100 to 250 degrees C. (preferably 120 degrees C.)
Pressure: 1 to 100 Torr (preferably 20 Torr)
Flow rate of the organic compound gas: 50 to 500 sccm (e.g., 100 sccm)
Processing time: 10 to 300 seconds (e.g., 180 seconds)

Figure 5:
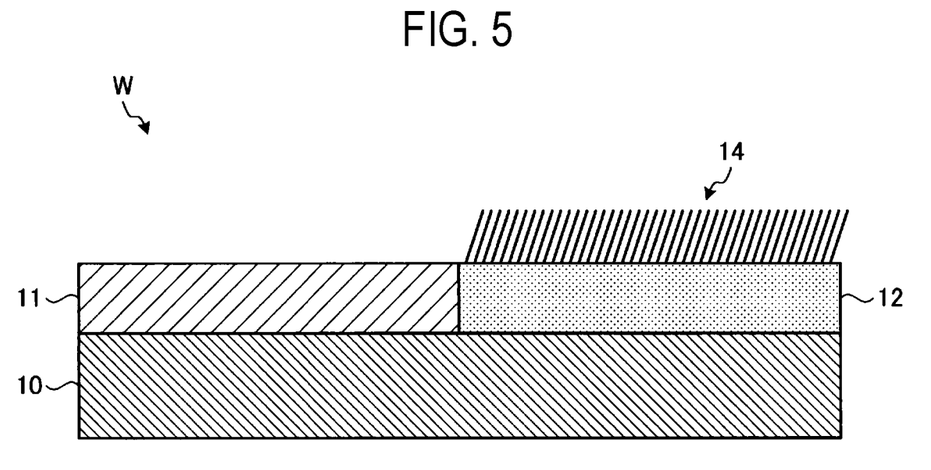
FIG. 5 is a cross-sectional view illustrating an exemplary substrate after an SAM is formed on an insulating film.

As a result, the state of the substrate W becomes, for example, as illustrated in FIG. 5. FIG. 5 is a cross-sectional view illustrating an exemplary substrate W after an SAM 14 is formed on the insulating film 12. After the process of step S12 is executed, the substrate W is unloaded from the SAM supply apparatus 300 by the transfer mechanism 106 and loaded into the film forming apparatus 400.

Subsequently, the second film forming process is executed (S13). In the second film forming process of step S13, a titanium nitride film is deposited on the substrate W through ALD in the film forming apparatus 400 into which the substrate W has been loaded. In ALD, a cycle including an adsorption process, a first purging process, a reaction process, and a second purging process is repeated a predetermined number of times.

In the adsorption process, a raw material gas, such as TDMATi gas, is supplied into the film forming apparatus 400. As a result, molecules of the raw material gas are chemically adsorbed on the surface of the metal film 11. However, the molecules of the raw material gas are hardly adsorbed on the SAM 14. The main processing conditions in the adsorption process are, for example, as follows.

Temperature of the substrate W: 100 to 250 degrees C. (preferably 200 degrees C.)
Pressure: 1 to 10 Torr (preferably 3 Torr)
Flow rate of the raw material gas: 10 to 500 sccm
Processing time: 0.3 to 10 seconds In the first purging process, the molecules of the raw material gas excessively adsorbed on the metal film 11 are removed by providing an inert gas, such as nitrogen gas, into the film forming apparatus 400. The main processing conditions in the first purging process are, for example, as follows.

Temperature of the substrate W: 100 to 250 degrees C. (preferably 200 degrees C.)
Pressure: 1 to 10 Torr (preferably 3 Torr)
Flow rate of the inert gas: 1,000 to 6,000 sccm
Processing time: 3 to 30 seconds In the reaction step, a reaction gas, such as $NH_3$ gas, is supplied into the film forming apparatus 400, and the molecules of the reaction gas react with the molecules of the raw material gas adsorbed on the metal film 11. Thus, a titanium nitride film is formed on the metal film 11. At this time, since there are almost no molecules of the raw material gas on the SAM 14, the titanium nitride film is hardly formed on the SAM 14. The main processing conditions in the reaction step are, for example, as follows.

Substrate W temperature: 100 to 250 degrees C. (preferably 200 degrees C.)
Pressure: 1 to 10 Torr (preferably 3 Torr)
Flow rate of $NH_3$ gas: 100 to 2000 sccm (e.g., 1000 sccm)
Processing time: 0.3 to 10 seconds In the second purging process, molecules of unreacted raw material gas and the like on the metal film 11 are removed by providing an inert gas, such as nitrogen gas, into the film forming apparatus 400. The main processing conditions in the second purging process are the same as the processing conditions in the first purging process described above.

Figure 6:
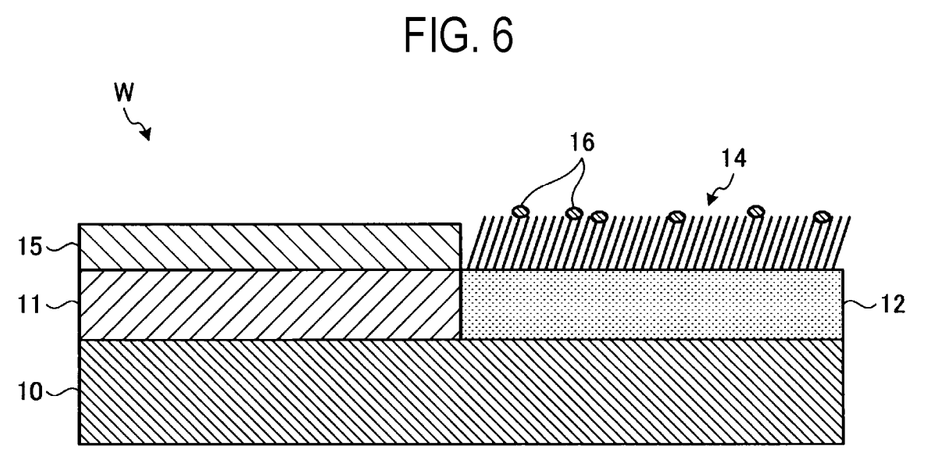
FIG. 6 is a cross-sectional view illustrating an exemplary substrate after a titanium nitride film is formed.

By repeating the cycle including the adsorption process, the first purging process, the reaction process, and the second purging process a predetermined number of times, a titanium nitride film 15 is formed on the metal film 11, for example, as illustrated in FIG. 6. FIG. 6 is a cross-sectional view illustrating an exemplary substrate W after the titanium nitride film 15 is formed. In addition, by repeating the above cycle, for example, as illustrated in FIG. 6, nuclei 16 of the titanium nitride film may be formed on the SAM 14.

When the above-described cycle is repeated even after the nuclei 16 of the titanium nitride film are formed on the SAM 14, the nuclei 16 grow and eventually the titanium nitride film is also formed on the SAM 14. In order to prevent this, it is necessary to remove the nuclei 16 formed on the SAM 14 before the nuclei 16 grow into the titanium nitride film. After the process of step S13 is executed, the substrate W is unloaded from the film forming apparatus 400 by the transfer mechanism 106 and loaded into the oxidation apparatus 500.

Subsequently, the oxidation process is executed (S14). In the oxidation process of step S14, an oxidation gas, such as $H_2O$ gas, is supplied into the oxidation apparatus 500 into which the substrate W has been loaded. A surface of the titanium nitride film 15 is oxidized by the oxidation gas. The main processing conditions in the oxidation process of step S14 are, for example, as follows.

Temperature of the substrate W: 120 to 350 degrees C. (preferably 200 degrees C.)
Pressure: 0.5 to 10 Torr (preferably 1 Torr)
Flow rate of the oxidation gas: 10 to 1,000 sccm
Processing time: 1 to 60 seconds (e.g., 30 seconds)

Figure 7:
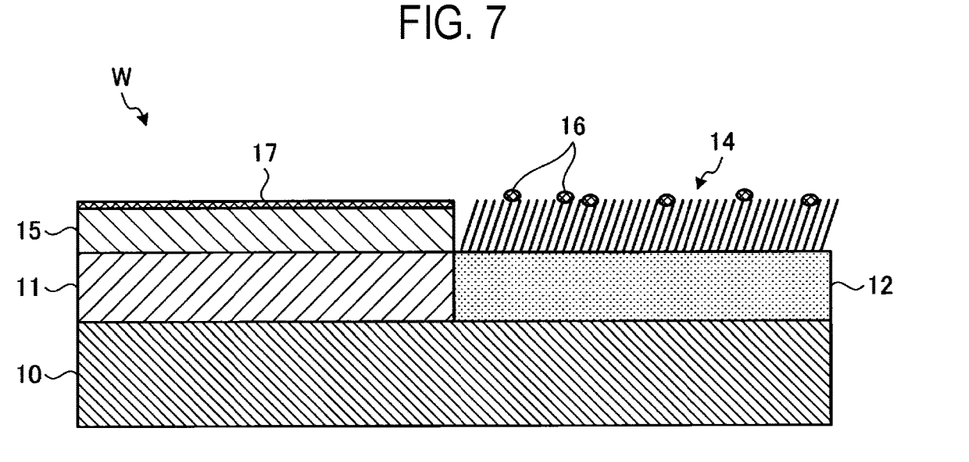
FIG. 7 is a cross-sectional view illustrating an exemplary substrate after a surface of the titanium nitride film is oxidized.

FIG. 7 is a cross-sectional view illustrating an exemplary substrate W after the surface of the titanium nitride film 15 is oxidized. For example, as illustrated in FIG. 7, a titanium oxide film 17 is formed on the surface of the titanium nitride film 15 by oxidizing the titanium nitride film 15. In addition, the nuclei 16 on the SAM 14 are also oxidized and changed to a titanium oxide film. Here, the titanium oxide film 17 is formed only on the surface of the titanium nitride film 15. On the other hand, since each nucleus 16 is smaller than those of the titanium nitride film 15, all the nuclei 16 are oxidized and turned into a titanium oxide film. After the process of step S14 is executed, the substrate W is unloaded from the oxidation apparatus 500 by the transfer mechanism 106 and loaded into the SAM supply apparatus 300 again.

Figure 8:
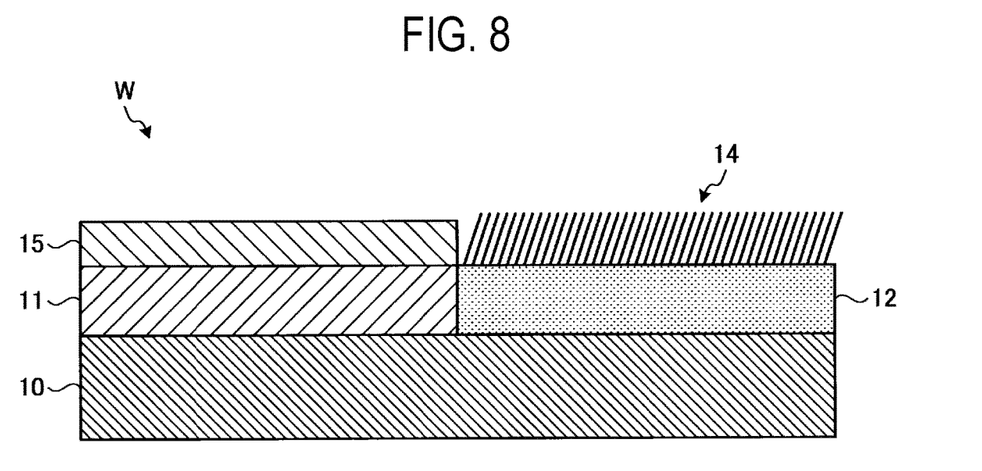
FIG. 8 is a cross-sectional view illustrating an exemplary substrate after a titanium oxide film is removed.

Subsequently, the second removal process is executed (S15). In the second removal process of step S15, a gas of an organic compound for forming an SAM is also supplied into the SAM supply apparatus 300 into which the substrate W has been loaded. Molecules of the organic compound supplied into the SAM supply apparatus 300 include fluorine and carbon. Therefore, the titanium oxide film 17 on the titanium nitride film 15 is fluorinated by the organic compound gas supplied into the SAM supply apparatus 300, and as illustrated in FIG. 8, for example, is turned into a volatile titanium fluoride compound and separated from the titanium nitride film 15.

In addition, the nuclei 16 of the titanium oxide film on the SAM 14 are also fluorinated by the organic compound gas supplied into the SAM supply apparatus 300, and turned into a volatile titanium fluoride compound and separated from the SAM 14. As a result, the nuclei 16 on the SAM 14 are removed, for example, as illustrated in FIG. 8. The main processing conditions in the second film forming process of step S15 are, for example, as follows.

Temperature of the substrate W: 120 to 250 degrees C. (preferably 200 degrees C.)
Pressure: 0.5 to 10 Torr (preferably 1 Torr)
Flow rate of the organic compound gas: 50 to 500 sccm (e.g., 100 sccm)
Processing time: 1 to 60 seconds (e.g., 30 seconds)

Subsequently, it is determined whether or not steps S13 to S15 have been executed a predetermined number of times (S16). The predetermined number of times is the number of times that causes the titanium nitride film 15 having a predetermined thickness to be formed on the metal film 11. When steps S13 to S15 have not been executed the predetermined number of times (S16: "No"), the process illustrated in step S13 is executed again.

On the other hand, when steps S13 to S15 have been executed the predetermined number of times (S16: "Yes"), the substrate W is unloaded from the SAM supply apparatus 300 by the transfer mechanism 106 and loaded into one of the load-lock chambers 102. Then, after the pressure in the load-lock chamber 102 is returned to the atmospheric pressure, the substrate W is unloaded from the load-lock chamber 102 by the transfer mechanism 108 and returned to the carrier C. Then, the film forming method illustrated in this flowchart is completed.

Here, when the nuclei 16 on the SAM 14 are removed by etching with hydrogen fluoride or the like, the nuclei 16 are removed, but the SAM 14 is also damaged and the molecules constituting the SAM 14 are reduced. Thus, when the formation of the titanium nitride film continues as it is after the nuclei 16 on the SAM 14 are removed, the titanium nitride film is likely to be formed on the insulating film 12. Therefore, in order to suppress the formation of the titanium nitride film on the insulating film 12, it is necessary to adsorb the molecules constituting the SAM 14 on the insulating film 12 again after the nuclei 16 on the SAM 14 are removed. As a result, since the time required for selectively depositing the titanium nitride film 15 having a desired thickness becomes long, it is difficult to improve productivity of a semiconductor device using the substrate W.

On the other hand, in the present embodiment, in step S15, the nuclei 16 on the SAM 14 are removed by the organic compound gas supplied into the SAM supply apparatus 300. Thus, the SAM 14 is not damaged when the nuclei 16 on the SAM 14 are removed. Therefore, it is possible to omit the process of adsorbing the molecules constituting the SAM 14 on the insulating film 12 again. As a result, it is possible to shorten the time required for selectively depositing the titanium nitride film 15 having a desired thickness, and thus it is possible to improve productivity of a semiconductor device using the substrate W.

An embodiment has been described above. As described above, the film forming method of the present embodiment relates to a method of selectively forming a film on a substrate, and includes the preparation process, the first removal process, the first film forming process, the second film forming process, the oxidation process, and the second removal process. In the preparation process, the substrate W having the surface to which the metal film 11 and the insulating film 12 are exposed is prepared. In the first removal process, the natural oxide film 13 on the metal film 11 is removed. In the first film forming process, the SAM 14 is formed on the insulating film 12 by providing the substrate W with the organic compound for forming the SAM 14 that suppresses formation of a titanium nitride film. The organic compound for forming the SAM 14 include functional groups including fluorine and carbon. In the second film forming process, the titanium nitride film 15 is formed on the metal film 11. In the oxidation process, the surface of the substrate W is oxidized. In the second removal process, the titanium oxide film formed on the metal film 11 and the SAM 14 is removed by providing the surface of the substrate W with the organic compound for forming the SAM 14. This makes it possible to improve the productivity of a semiconductor device using selective film formation.

In addition, in the above-described embodiment, the organic compound for forming the SAM 14 is an organic compound having a binding functional group adsorbed on the surface of the insulating film 12 and a functional group containing fluorine and carbon. As the organic compound for forming the SAM 14, for example, a trichlorosilane-based SAM, a methoxysilane-based SAM, an ethoxysilane-based SAM, or the like may be used. Examples of the trichlorosilane-based SAM include $CF_3(CF_2)_xCH_2CH_2SiCl_3$. Examples of the methoxysilane-based SAM include $CF_3(CF_2)_xCH_2CH_2Si(OCH_3)_3$. Examples of the ethoxysilane-based SAM include $CF_3(CF_2)_xCH_2CH_2Si(OCH_2CH_3)_3$. "X" in the above-mentioned chemical formulae is an integer of 0 to 13. As a result, the SAM 14 is selectively formed on the insulating film 12 without being formed on the metal film 11.

Further, in the above-described embodiment, in the oxidation process, the surface of the substrate W is oxidized by providing the surface of the substrate W with $H_2O$ gas, $H_2O_2$ gas, $O_2$, or $O_3$ gas). This makes it possible to oxidize the nuclei 16 of the titanium nitride film on the SAM 14 and to remove the nuclei 16 on the SAM 14 in the second removal process performed subsequently.

In addition, in the above-described embodiment, the metal film 11 is a film of amorphous silicon, copper, tungsten, or cobalt, and the insulating film 12 is a silicon oxide film, a silicon nitride film, or a spin-on carbon film. This makes it possible to implement selective film formation of a titanium nitride film on the substrate W.

Further, in the above-described embodiment, in the first removal process, the natural oxide film 13 on the metal film 11 is removed by plasma. This makes it possible to suppress the SAM 14 from being adsorbed on the surface of the metal film 11.

[Others]

The technology disclosed in the present application is not limited to the above-described embodiment, and various modifications can be made within the scope of the gist thereof.

For example, in the above-described embodiment, in the second removal process of step S15, the titanium oxide film 17 on the titanium nitride film 15 and the nuclei 16 on the SAM 14 are removed by providing the organic compound gas into the SAM supply apparatus 300 into which the substrate W has been loaded. However, the technique disclosed herein is not limited thereto. For example, in the second removal process of step S15, a fluorine-containing gas may be supplied to the SAM supply apparatus 300 into which the substrate W has been loaded, in addition to the organic compound gas for forming the SAM 14. The fluorine-containing gas is at least one selected from, for example, hydrogen fluoride gas, carbon tetrafluoride gas, monofluoromethane gas, difluoromethane gas, trifluoromethane gas, ethane hexafluoride gas, propane octafluoride gas, cyclobutane octafluoride gas, hexafluoro-1,3-butadiene gas, sulfur hexafluoride gas, nitrogen trifluoride gas, and chlorine trifluoride gas. This makes it possible to shorten the time required for the second removal process of step S15.

Here, when the fluorine-containing gas is supplied to the surface of the substrate W on which the SAM 14 is formed, some of the molecules constituting the SAM 14 are decomposed. However, in addition to the fluorine-containing gas, the organic compound gas for forming the SAM 14 is also supplied into the SAM supply apparatus 300. Therefore, even when some of the molecules constituting the SAM 14 are decomposed, the molecules are immediately replenished. Thus, the function of suppressing deposition of a titanium nitride film in the SAM 14 is maintained.

In addition, in the above-described embodiment, in the first removal process of step S11, the natural oxide film 13 formed on the surface of the metal film 11 is removed by the plasma of hydrogen gas, but the technique disclosed herein is not limited thereto. For example, the natural oxide film 13 formed on the surface of the metal film 11 may be removed by wet etching using hydrofluoric acid or the like.

In addition, in the above-described embodiment, in the second film forming process of step S13, the titanium nitride film is deposited on the substrate W through ALD, but the technique disclosed herein is not limited thereto. As another example, the titanium nitride film may be formed on the substrate W through chemical vapor deposition (CVD).

In addition, in the above-described embodiment, the film forming system 100 is provided with one plasma processing apparatus 200, one SAM supply apparatus 300, one film forming apparatus 400, and one oxidation apparatus 500, but the technique disclosed herein is not limited thereto. For example, the film forming system 100 may be provided with a plurality of apparatuses that perform most time-consuming processes, and the other processes may be implemented by one apparatus. For example, when the processes of steps S12 and S15 take a long time, a plurality of SAM supply apparatuses 300 that perform the processes of steps S12 and S15 may be provided and one apparatus that performs the processes of steps S11, S13, and S14 may be provided. This makes it possible to reduce the waiting time for processes when processing a plurality of substrates W.

It shall be understood that the embodiments disclosed herein are examples in all respects and are not restrictive. Indeed, the above-described embodiments can be implemented in various forms. The embodiments described above may be omitted, replaced, or modified in various forms without departing from the scope and spirit of the appended claims.

EXPLANATION OF REFERENCE NUMERALS

C: carrier, G: gate valve, W: substrate, 10: base material, 11: metal film, 12: insulating film, 13: natural oxide film, 14: SAM, 15: titanium nitride film, 16: nuclei, 17: titanium oxide film, 100: film forming system, 101: vacuum transfer chamber, 102: load-lock chamber, 103: atmospheric transfer chamber, 104: alignment chamber, 105: port, 106: transfer mechanism, 107: arm, 108: transfer mechanism, 110: controller, 200: plasma processing apparatus, 300: SAM supply apparatus, 400: film forming apparatus, 500: oxidation apparatus

What is claimed is:

1. A method of selectively forming a film on a substrate, the method comprising:
   a preparation process of preparing a substrate having a surface to which a metal film and an insulating film are exposed;

a first removal process of removing a natural oxide film on the metal film;

a first film forming process of forming a self-assembled monolayer, which suppresses formation of a titanium nitride film, on the insulating film by providing the substrate with a compound for forming the self-assembled monolayer, the compound having a functional group containing fluorine and carbon;

a second film forming process of forming a titanium nitride film on the metal film;

an oxidation process of oxidizing the surface of the substrate; and a second removal process of removing a titanium oxide film, which is formed on the metal film and the self-assembled monolayer, by providing the surface of the substrate with the compound.

2. The method of claim 1, wherein the compound has a binding functional group adsorbed on the surface of the insulating film and a functional group containing fluorine and carbon.

3. The method of claim 2, wherein the compound is a trichlorosilane-based self-assembled monolayer material, a methoxysilane-based self-assembled monolayer material, or an ethoxysilane-based self-assembled monolayer material.

4. The method of claim 3, wherein the oxidation process includes oxidizing the surface of the substrate by providing the surface of the substrate with $H_2O$ gas, $H_2O_2$ gas, $O_2$ gas, or $O_3$ gas.

5. The method of claim 4, to wherein the metal film is an amorphous silicon film, a copper film, a tungsten film, or a cobalt film, and wherein the insulating film is a silicon oxide film, a silicon nitride film, or a spin-on carbon film.

6. The method of claim 5, wherein the first removal process includes removing the natural oxide film on the metal film by plasma.

7. The method of claim 6, wherein in the second removal process includes removing the titanium oxide film, which is formed on the metal film and the self-assembled monolayer, by providing the surface of the substrate with a fluorine-containing gas in addition to the compound.

8. The method of claim 7, wherein the fluorine-containing gas is at least one selected from hydrogen fluoride gas, carbon tetrafluoride gas, monofluoromethane gas, difluoromethane gas, trifluoromethane gas, ethane hexafluoride gas, propane octafluoride gas, cyclobutane octafluoride gas, hexafluoro-1,3-butadiene gas, sulfur hexafluoride gas, nitrogen trifluoride gas, and chlorine trifluoride gas.

9. The method of claim 1, wherein the oxidation process includes oxidizing the surface of the substrate by providing the surface of the substrate with $H_2O$ gas, $H_2O_2$ gas, $O_2$ gas, or $O_3$ gas.

10. The method of claim 1, wherein the metal film is an amorphous silicon film, a copper film, a tungsten film, or a cobalt film, and wherein the insulating film is a silicon oxide film, a silicon nitride film, or a spin-on carbon film.

11. The method of claim 1, wherein the first removal process includes removing the natural oxide film on the metal film by plasma.

12. The method of claim 1, wherein in the second removal process includes removing the titanium oxide film, which is formed on the metal film and the self-assembled monolayer, by providing the surface of the substrate with a fluorine-containing gas in addition to the compound.

* * * * *